(12) United States Patent
Burnett et al.

(10) Patent No.: US 7,609,541 B2
(45) Date of Patent: Oct. 27, 2009

(54) MEMORY CELLS WITH LOWER POWER CONSUMPTION DURING A WRITE OPERATION

(75) Inventors: James David Burnett, Austin, TX (US); Glenn C. Abeln, Austin, TX (US); Jack M. Higman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 75 days.

(21) Appl. No.: 11/616,635

(22) Filed: Dec. 27, 2006

(65) Prior Publication Data
US 2008/0158938 A1 Jul. 3, 2008

(51) Int. Cl.
*G11C 11/00* (2006.01)
(52) U.S. Cl. .................... 365/154; 365/226; 365/189.04
(58) Field of Classification Search ................. 365/154, 365/226, 189.04
See application file for complete search history.

(56) References Cited

U.S. PATENT DOCUMENTS

| | | | |
|---|---|---|---|
| 5,453,950 A | 9/1995 | Voss et al. | |
| 6,205,049 B1 | 3/2001 | Lien et al. | |
| 6,459,611 B2 | 10/2002 | Rimondi | |
| 6,903,962 B2* | 6/2005 | Nii | 365/156 |
| 7,440,313 B2* | 10/2008 | Abeln et al. | 365/154 |
| 2005/0162919 A1* | 7/2005 | Nii | 365/185.22 |
| 2006/0250880 A1* | 11/2006 | Ramaraju et al. | 365/230.05 |
| 2007/0139997 A1* | 6/2007 | Suzuki et al. | 365/154 |

OTHER PUBLICATIONS

Hiep Tran, Demonstration of 5T SRAM And 6T Dual-Port RAM Cell Arrays, IEEE 1996, pp. 68-69.

* cited by examiner

*Primary Examiner*—Thong Q Le
(74) *Attorney, Agent, or Firm*—Hamilton & Terrile, LLP; Michael Rocco Cannatti

(57) ABSTRACT

A memory cell including an access transistor coupled to a first storage node and a read port coupled to one of the first storage node or a second storage node is provided. The memory cell further includes a first inverter having an input terminal coupled to the first storage node, an output terminal, and a first power supply voltage terminal for receiving a first power supply voltage. The memory cell further includes a second inverter having an input terminal coupled to the output terminal of the first inverter, an output terminal coupled to the input terminal of the first inverter at the first storage node, and a second power supply voltage terminal for receiving a second power supply voltage, wherein the second power supply voltage is varied relative to the first power supply voltage during a write operation to the memory cell.

18 Claims, 4 Drawing Sheets

MEMORY CELLS WITH LOWER POWER CONSUMPTION DURING A WRITE OPERATION

BACKGROUND OF THE INVENTION

1. Field of the Invention

This invention relates in general to memory and more specifically to memory cells with lower power consumption during a write operation.

2. Description of the Related Art

Increasingly, low voltage and low power memory cells are being used in static random access memories (SRAMs) for use in portable applications. Further, portable applications are also requiring larger SRAM cache sizes. With the dual requirements of lower voltages and increased cache sizes, read and write stability of six transistors (6T) memory cells is difficult to maintain. To alleviate these issues, some implementations of SRAM are based on eight transistor (8T) memory cells.

Although such eight transistor (8T) memory cells have certain advantages, they are not suited for high-density SRAM designs, since they occupy more space than 6T memory cells. Furthermore, 8T cells are not suited for low power technology because of higher power consumption. In some instances, row-biasing is used to lower the power consumption of such 8T cells during a write operation. However, when row-biasing is implemented in such 8T cells, it further increases the memory cell size. This in turn, makes these 8T cells further unsuitable for high-density SRAM designs.

Thus, there is a need for memory cells with lower power consumption during a write operation.

BRIEF DESCRIPTION OF THE DRAWINGS

The present invention may be better understood, and its numerous objects, features, and advantages made apparent to those skilled in the art by referencing the accompanying drawings.

Figure 1:
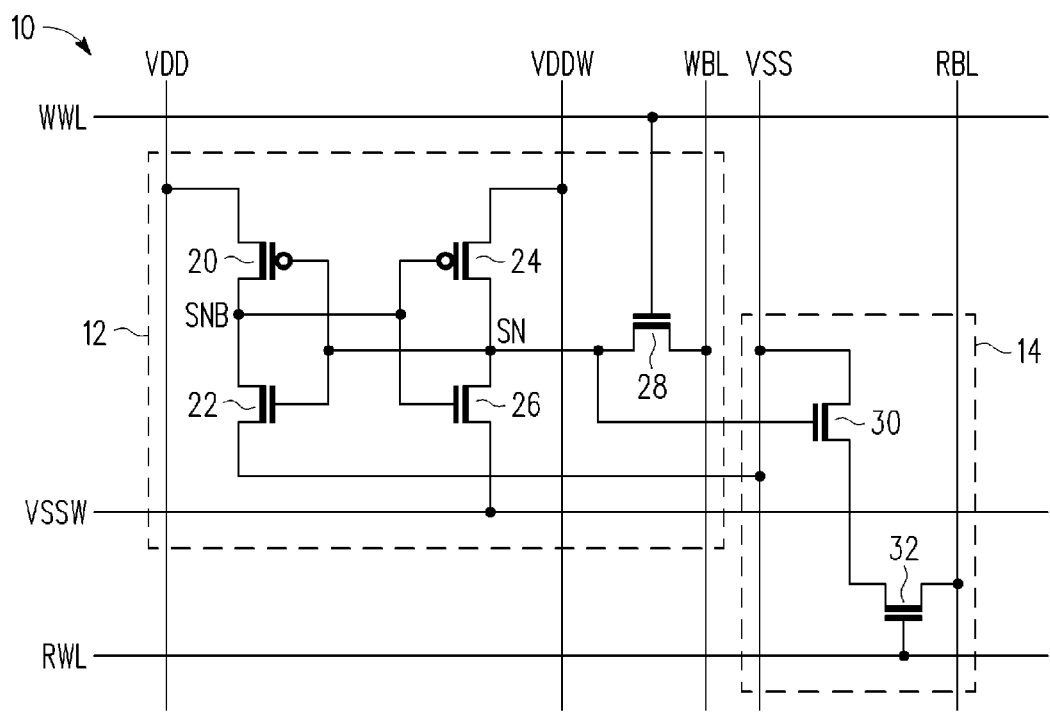
FIG. 1 shows a diagram of an exemplary memory cell, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

By way of example, a 7T memory cell is disclosed, which can provide an efficient implementation of either a source bias of one pull-up transistor or a source bias of one pull-down transistor to enable a lower voltage write operation using only one access (pass gate transistor). The 7T memory cell, as further described below, comprises two cross-coupled inverters, one pass gate for write operation, and a read port consisting of two n-MOS devices. The source bias can be provided along the row direction to provide lower power during the write operation.

In one aspect, a memory cell including a first and a second storage node is provided. The memory cell further includes an access transistor coupled to the first storage node and a read port coupled to one of the first or the second storage nodes. The memory cell further includes a first inverter having an input terminal coupled to the first storage node, an output terminal, and a first power supply voltage terminal for receiving a first power supply voltage. The memory cell further includes a second inverter having an input terminal coupled to the output terminal of the first inverter, an output terminal coupled to the input terminal of the first inverter at the first storage node, and a second power supply voltage terminal for receiving a second power supply voltage, wherein the second power supply voltage is varied relative to the first power supply voltage during a write operation to the memory cell. The term "coupled," as used herein, is not intended to be limited to a direct coupling.

In another aspect, a memory array including a plurality of memory cells organized in row and columns, wherein a row of memory cells comprises a word line and all of the memory cells coupled to the word line, wherein a column of memory cells comprises a bit line and all of the memory cells coupled to the bit line is provided. Each of the memory cells further includes a first inverter having an input terminal coupled to a first storage node, an output terminal coupled to a second storage node, a first power supply voltage terminal for receiving a first power supply voltage, and a ground terminal. Each of the memory cells further includes a second inverter having an input terminal coupled to the output terminal of the first inverter at the second storage node, an output terminal coupled to the input terminal of the first inverter at the first storage node, a second power supply voltage terminal, and a third power supply voltage terminal and a read port coupled to one of the first or the second storage nodes. The memory array further includes a first power supply conductor, coupled to the second power supply voltage terminals of each of the plurality of memory cells in a column of memory cells, the first power supply conductor traversing the memory array in a direction parallel to the column of memory cells. The memory array further includes a second power supply conductor, coupled to the third power supply voltage terminals of each of the plurality of memory cells in a row of memory cells, the second power supply conductor traversing the memory array in a direction parallel to the row of memory cells, wherein both of the second and third power supply voltage terminals receive power supply voltages that are independently variable with respect to the first power supply voltage.

In yet another aspect, a method for writing to a memory cell, the memory cell comprising a first inverter and a second inverter, the first inverter having an input terminal coupled to a first storage node and an output terminal coupled to a second storage node, the second inverter having an input terminal coupled to the second storage node and an output terminal coupled to the first storage node is provided. The method includes providing a first power supply voltage at a first potential to a first power supply voltage terminal of the second inverter. The method further includes providing a second power supply voltage at a second potential to a second power supply voltage terminal of the second inverter. The method further includes lowering the first power supply voltage and raising the second power supply voltage. The method further includes coupling the first storage node to a bit line. The method further includes returning the first power supply voltage to the first potential and returning the second power supply voltage to the second potential. The method further includes decoupling the first storage node from the bit line.

In a still another aspect, a method for writing to a memory cell, the memory cell comprising a first inverter and a second inverter, the first inverter having an input terminal coupled to a first storage node and an output terminal coupled to a second storage node, the second inverter having an input terminal coupled to the second storage node and an output terminal coupled to the first storage node, and a read port coupled to the one of the first or second storage nodes is provided. The method includes providing a first power supply voltage at a first potential to a first power supply voltage terminal of the second inverter. The method further includes providing a second power supply voltage at a second potential to a second power supply voltage terminal of the second inverter. The method further includes lowering the first power supply voltage and coupling the first storage node to a bit line. The method further includes returning the first power supply voltage to the first potential and decoupling the first storage node from the bit line.

Referring now to FIG. 1, FIG. 1 shows a diagram of an exemplary memory cell 10, consistent with one embodiment of the invention. Memory cell 10 may include a 5T cell 12 and a read port 14, such that memory cell 10 can act as a 7T dual-port memory cell. Memory cell 10 may be coupled to a write word line WWL, read word line RWL, a write bit line WBL, and a read bit line RBL. 5T cell 12 includes two cross-coupled inverters and an access transistor 28, an n-MOS transistor, as shown in FIG. 1. The first inverter may include transistors 20 and 22 and the second inverter may include transistors 24 and 26. 5T cell 12 may have a first storage node SN and a second storage node SNB. An input terminal of the first inverter may be coupled to the storage node SN. A power supply terminal of the first inverter may be coupled to a power supply terminal for receiving voltage VDD. Another power supply terminal of the first inverter may be coupled to another power supply terminal for receiving voltage VSS, which may be ground voltage. An input terminal of the second inverter may be coupled to output terminal of the first inverter. An output terminal of the second inverter may be coupled to the input terminal of the first inverter at the storage node SN. A power supply terminal of the second inverter may be coupled to a power supply voltage terminal for receiving voltage VDDW. Another power supply terminal of the second inverter may be coupled to another power supply voltage terminal for receiving voltage VSSW, which may be ground voltage. The VDDW voltage line and the VSSW voltage line could be provided in a direction parallel to the word lines. The first access transistor 28 may be coupled to the first storage node SN.

Referring still to FIG. 1, as noted above, memory cell 10 may further include a read port 14, which may include transistors 30 and 32. Read port 14 may be coupled to storage node SN or alternatively to storage node SNB. A current electrode of transistor 30 may be coupled to the power supply terminal for receiving the VSS voltage. A control electrode of transistor 30 may be coupled to storage node SN. A current electrode of transistor 32 may be coupled to a second current electrode of transistor 30. A control electrode of transistor 30 may be coupled to read word line RWL. A second current electrode of transistor 32 may be coupled to read bit line RBL.

Figure 2:
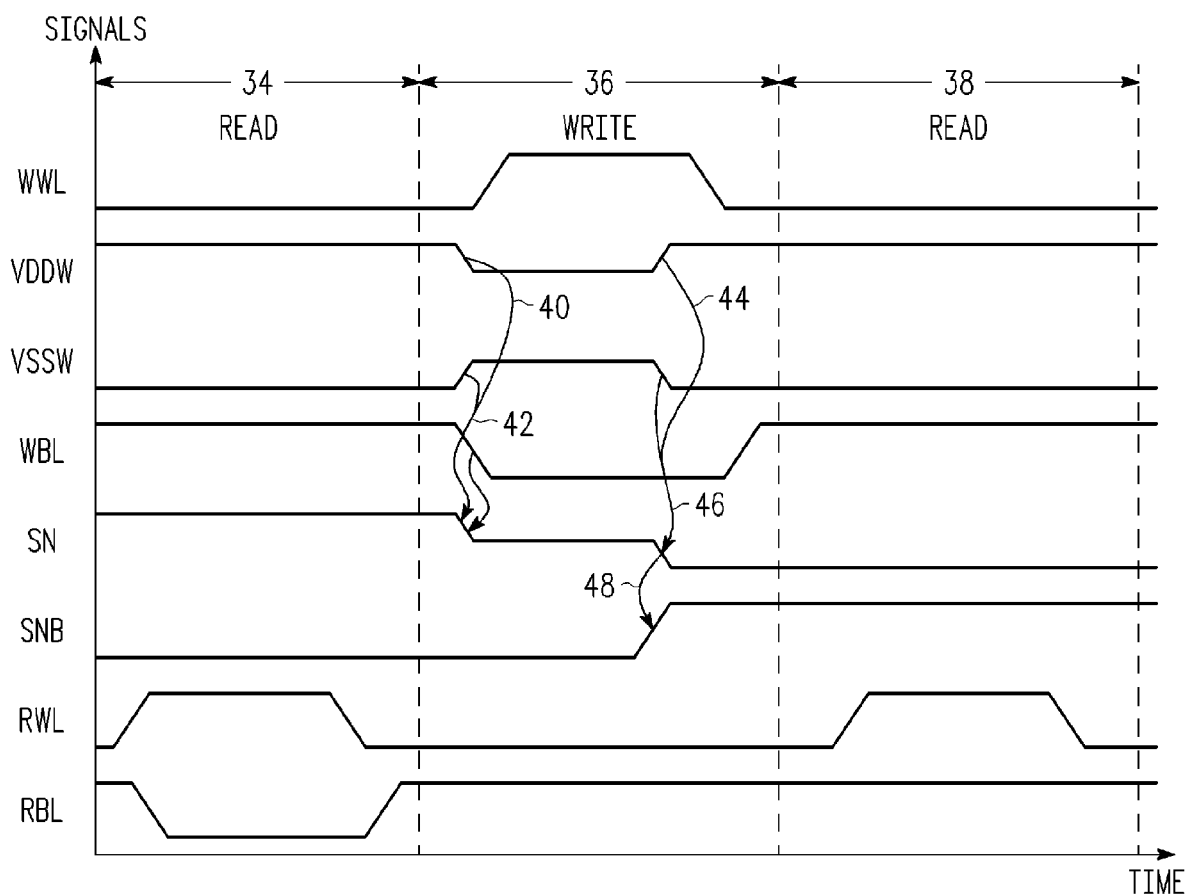
FIG. 2 shows an exemplary timing diagram for operating the memory cell of FIG. 1, consistent with one embodiment of the invention.

In operation, during a write operation when write word line WWL is equal to VSS and VSSW is equal to VDD or VDDW is equal to VSS, memory cell 10 may be cleared allowing access transistor 28 to write the cell with similar voltages as a 6T cell. Thus, unlike a conventional 6T cell, which has two access transistors (also referred to as pass gate transistors), memory cell may have a 5T cell with only one access transistor 28. Specific operation of exemplary memory cell 10 is now explained with reference to FIG. 2, which shows an exemplary timing diagram for memory cell 10. During a read operation (34) read word line RWL may be asserted. During write operation (36) write word line WWL may be asserted to turn on access transistor 28 and a write bit line WBL may be asserted (lowered), such that a bit may be written to memory cell 10. In particular, the assertion of write word line WWL and write bit line WBL results in the voltage at the storage node SN being pulled down. At substantially the same time, during the write operation, VDDW voltage may be applied only to transistor 24, the p-MOS transistor, in the row. At substantially the same time, VSSW voltage may be asserted. The transition in VDDW voltage and VSSW voltage also acts to pull down the voltage at the storage node SN (as indicated by reference symbols 40 and 42). The combination of the transition in VDDW voltage and VSSW voltage with the assertion of write bit line WBL results in the storage node SN transitioning to a lower voltage than would occur if only word bit line WBL were asserted. Subsequently, when the VDDW voltage is pulled up again and the VSSW voltage is pulled down, the voltage at storage node SN would further go down, as indicated by reference symbols 44 and 46. Due to the action of the cross-coupled inverters, this transition in the voltage at storage node SN would result in the voltage at node SNB to be pulled up (as indicated by reference symbol 48). Further, as indicated in FIG. 2, during a read operation (38) subsequent to the write operation (36), the read word line RWL may be asserted. Although not shown, a sense amplifier may be coupled to read bit line RBL to sense the voltage on the read bit line to determine the state of memory cell 10.

Figure 3:
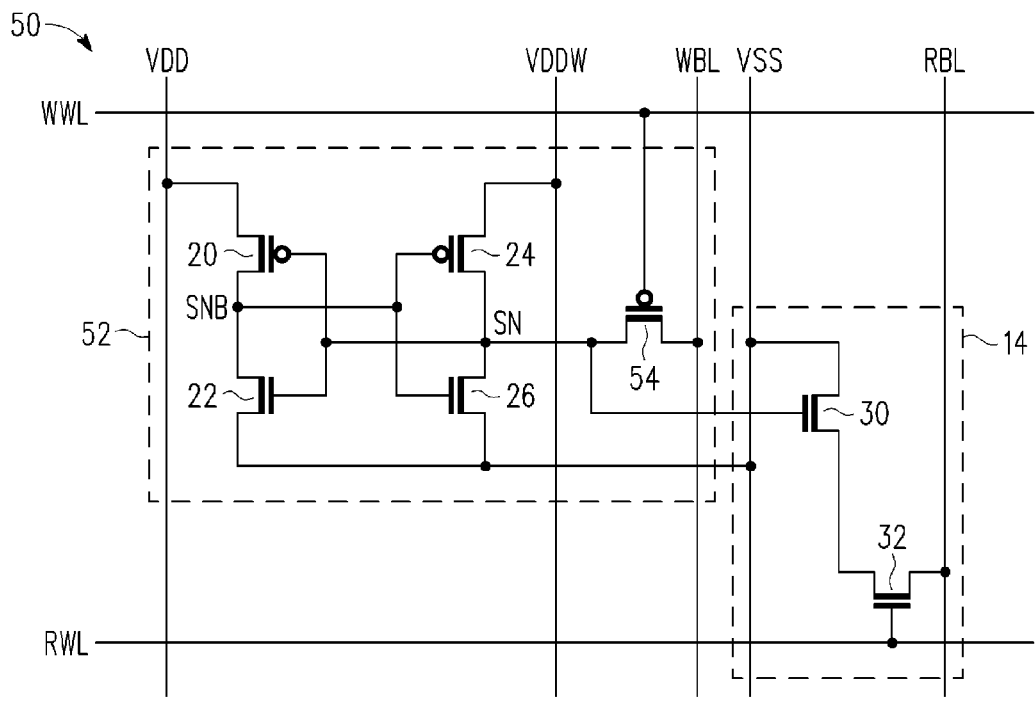
FIG. 3 shows a diagram of an exemplary memory cell, consistent with one embodiment of the invention.

FIG. 3 shows a diagram of an exemplary memory cell 50, consistent with one embodiment of the invention. Memory cell 50 may include a 5T cell 52 and a read port 14, such that memory cell 50 can act as a dual-port memory cell. Like memory cell 10, memory cell 50 may be coupled to a write word line WWL, read word line RWL, a write bit line WBL, and a read bit line RBL. 5T cell 52 includes two cross-coupled inverters and an access transistor 54, an-MOS transistor, as shown in FIG. 3. The first inverter may include transistors 20 and 22 and the second inverter may include transistors 24 and 26. 5T cell 52 may have a first storage node SN and a second storage node SNB. An input terminal of the first inverter may be coupled to the storage node SN. A power supply terminal of the first inverter may be coupled to a power supply terminal for receiving voltage VDD. Another power supply terminal of the first inverter may be coupled to another power supply terminal for receiving voltage VSS, which may be ground voltage. An input terminal of the second inverter may be coupled to output terminal of the first inverter. An output terminal of the second inverter may be coupled to the input terminal of the first inverter at the storage node SN. A power supply terminal of the second inverter may be coupled to a power supply voltage terminal for receiving voltage VDDW. Another power supply terminal of the second inverter may be coupled to another power supply voltage terminal for receiving voltage VSS, which may be ground voltage. The VDDW voltage line could be provided in a direction parallel to the word lines. The access transistor 54 may be coupled to the first storage node SN.

Figure 4:
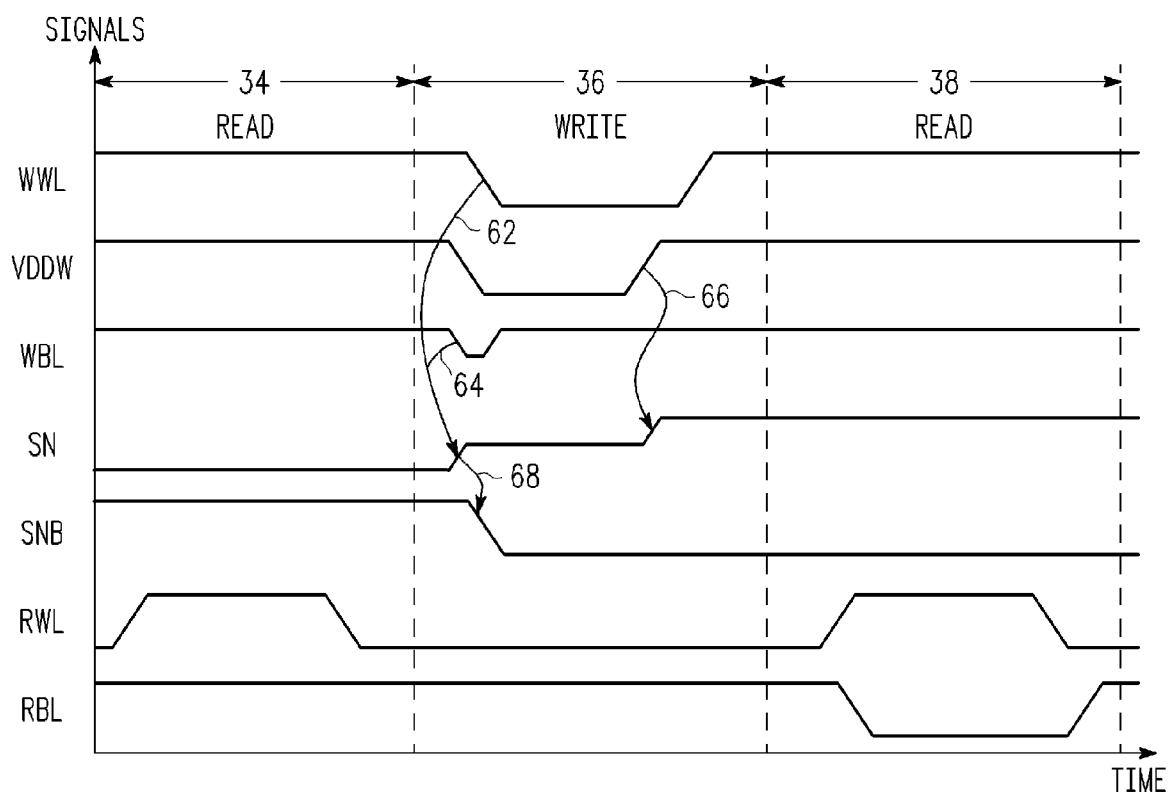
FIG. 4 shows an exemplary timing diagram for operating the memory cell of FIG. 3, consistent with one embodiment of the invention.

FIG. 4 shows an exemplary timing diagram for operating the memory cell 50 of FIG. 3, consistent with one embodiment of the invention. During a read operation (34) read word line RWL may be asserted. During a write operation (36) write word line WWL and write bit line WBL may be asserted. At substantially the same time, during the write operation, VDDW voltage may be applied to only transistor 24, the p-MOS transistor, in the row. The transition in the signal on write word line WWL results in the voltage at the storage node SN to be pulled up (as indicated by reference symbols 62 and 64), as the storage node SN is charged from write bit line WBL through access transistor 54. Due to the action of cross-coupled inverters, when the voltage at storage node SN is sufficiently high, the voltage at node SNB is pulled down (as indicated by reference symbol 68). Subsequently, when the VDDW voltage is pulled up, the voltage at storage node SN would be further pulled up, as indicated by reference symbol 66. Further, as indicated in FIG. 2, during a read operation (38) subsequent to the write operation (36), the read word line RWL and the read bit line RBL may be asserted.

Figure 5:
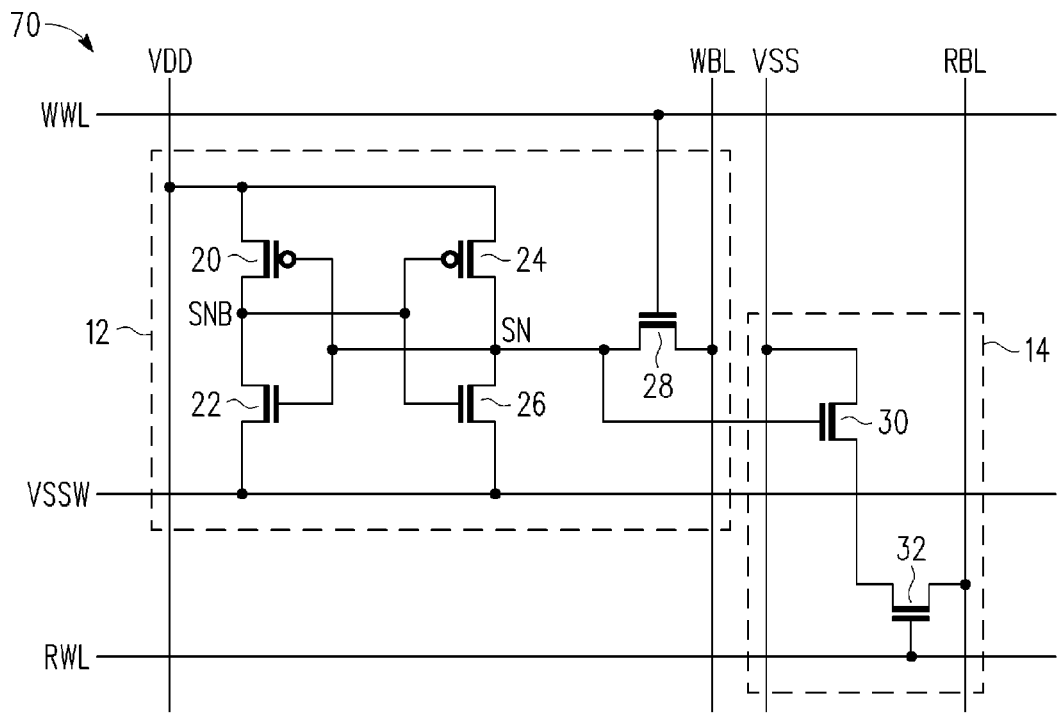
FIG. 5 shows a diagram of an exemplary memory cell, consistent with one embodiment of the invention.

FIG. 5 shows a diagram of an exemplary memory cell 70, consistent with one embodiment of the invention. Memory cell 70 has the same elements as memory cell 10 of FIG. 1. However, unlike memory cell 10 of FIG. 1, a current electrode of transistor 24 is not coupled to VDDW voltage. Instead, the current electrode of transistor 24 is coupled to the power supply terminal for receiving the VDD voltage. In operation, the state of the bitcell may be cleared before the write operation by setting VSSW=VDD, when write word line WWL=VSS. When the bitcell is cleared, the voltage at both storage nodes SN and SNB is now equal to VDD. In this case, all four transistors 20, 22, 24, and 26 are turned off. It is then possible to write the cell by asserting write word line WWL and either charging or discharging storage node SN through access transistor 28. A high state can be written to cell by asserting write bit line WBL (WBL=VDD) and a low state can be written by de-asserting write bit line WBL (WBL=VSS). To complete the write operation, write word line WWL is de-asserted, and VSSW is again set to VSS. The action of the cross-coupled inverters then causes the bitcell to latch the value written to the storage node SN and completes the write operation. The read operation is carried in a similar manner to read operation 38 in FIG. 2.

Figure 6:
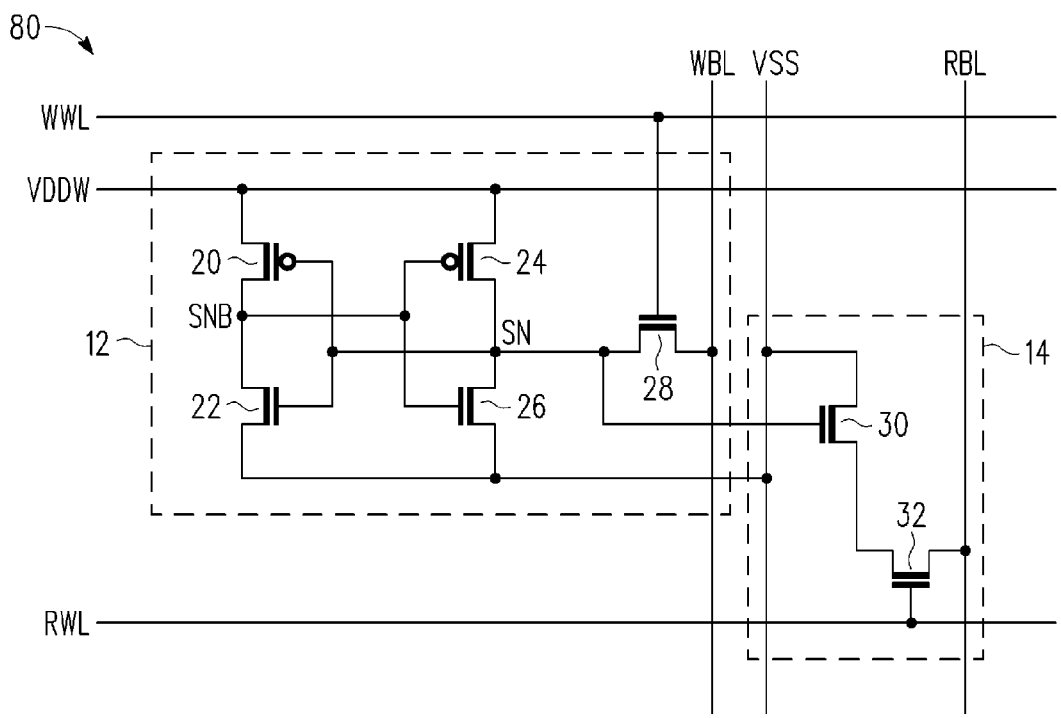
FIG. 6 shows a diagram of an exemplary memory cell, consistent with one embodiment of the invention.

FIG. 6 shows a diagram of an exemplary memory cell 80, consistent with one embodiment of the invention. Memory cell 80 has the same elements as memory cell 10 of FIG. 1. However, unlike memory cell 10 of FIG. 1, a current electrode of transistor 20 and a current electrode of transistor 24 are coupled to a power supply terminal for receiving the VDDW voltage. In operation, the state of the bitcell may be cleared before the write operation by setting VDDW=VSS when write word line WWL=VSS. When cleared, the voltage at both storage nodes SN and SNB is now equal to VSS. In this case, all four transistors 20, 22, 24, and 26 are turned off since all power supply voltages are equal to VSS. It is then possible to write the cell by asserting write word line WWL and either charging or discharging the storage node SN through access transistor 28. A high state can be written to cell by asserting write bit line WBL (WBL=VDD) and a low state can be written by de-asserting write bit line WBL (WBL=VSS). To complete the write operation, write word line WWL is de-asserted, and VDDW is again set to VDD. The action of the cross-coupled inverters then causes the cell to latch the value written to the storage node SN and completes the write operation. The read operation is carried in a similar manner to read operation 38 in FIG. 2.

Figure 7:
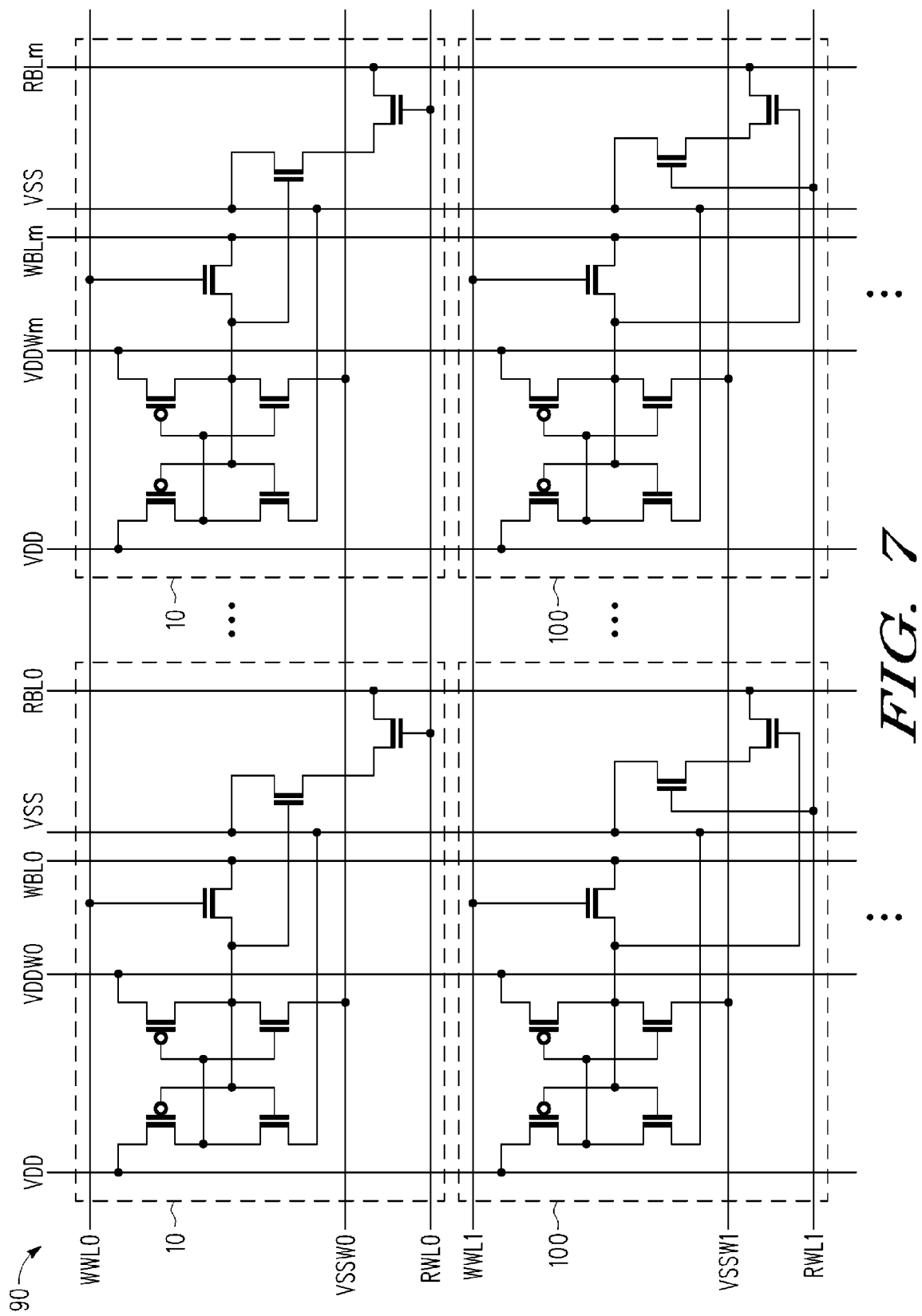
FIG. 7 shows a portion of an exemplary memory array, consistent with one embodiment of the invention.

FIG. 7 shows a portion of an exemplary memory array 90, consistent with one embodiment of the invention. Memory array 90 may include memory cells 10 and 100 arranged in rows and columns. Although memory array 90 shows only four memory cells for illustrative purposes, memory array 90 may include any number of memory cells. A row of memory cells, such as memory cells labeled 10 are coupled to a write word line WWL0. Another row of memory cells, such as memory cells 100 are coupled to another write word line WWL1. Each memory cell is coupled to read bit lines RBL0 and RBLm, for example. Thus, at each intersection of a word line and a bit line, a memory cell is located. Each memory cell is further coupled to read word lines RWL0 and RWL1. As explained above memory cell 10 includes two cross-coupled inverters, an access transistor, and a read port. Memory cell 100 also includes two cross-coupled inverters, an access transistor, and a read port. Memory array 90 includes power supply conductors (labeled VDDW0 and VDDWm) that run in a direction parallel to the columns in the memory array. The power supply conductor labeled VDDW0 is coupled to the second power supply terminal of memory cells 10 and 100 in the first column of memory array 90. The power supply conductor labeled VDDWm is coupled to the second power supply terminal of memory cells 10 and 100 in the mth column of memory array 90. Memory array further includes power supply conductors (labeled VSSW0 and VSSW1) that run in a direction parallel to the rows in the memory array. The power supply conductor labeled VSSW0 is coupled to the third power supply terminal of memory cells 10 and 100 in the first row of memory cell array 90. The power supply conductor labeled VSSW1 is coupled to the third power supply terminal of memory cells 10 and 100 in the second row of memory array 90. The voltage at power supply conductors VSSW0, VSSW1, VDDW0, and VDDWm may be varied independently of the voltage VDD applied to the first power supply terminal. By way of example, during a write operation, (VDDW-VSSW) voltage may be lower than (VDD-VSS) voltage. VSSW0 and VSSW1 can be modulated so as not to affect data retention in cells along rows not being read. During a read operation, VDDW0 and VDDW1 are held at VDD and VSSW0 and VSSW1 are held at VSS, while either read word line RWL0 or read word line RWL1 is asserted to read data from the intended row.

Although the invention is described herein with reference to specific embodiments, various modifications and changes can be made without departing from the scope of the present invention as set forth in the claims below. For example, each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory cell, comprising:
    a first and a second storage node;
    an access transistor coupled to the first storage node;
    a read port coupled to one of the first or the second storage nodes;
    a first inverter having an input terminal coupled to the first storage node, an output terminal, and a first power supply voltage terminal for receiving a first power supply voltage; and
    a second inverter having an input terminal coupled to the output terminal of the first inverter, an output terminal coupled to the input terminal of the first inverter at the first storage node, and a second power supply voltage terminal for receiving a second power supply voltage that is not supplied to the first inverter, wherein the second power supply voltage is varied relative to the first power supply voltage during a write operation to the memory cell.

2. The memory cell of claim 1, wherein during the write operation, the second power supply voltage is lower than the first power supply voltage.

3. The memory cell of claim 1, wherein the read port comprises:
    a first transistor having a first current electrode coupled to a ground terminal, a control electrode coupled to the first storage node, and a second current electrode; and
    a second transistor having a first current electrode coupled to the second current electrode of the first transistor, a control electrode coupled to a read word line, and a second current electrode coupled to a read bit line.

4. The memory cell of claim 1, wherein the second inverter further comprises a third power supply voltage terminal for receiving a third power supply voltage, wherein one of the second power supply voltage or the third power supply voltage is varied during the write operation.

5. The memory cell of claim 1, wherein the second inverter further comprises a third power supply voltage terminal for receiving a third power supply voltage, wherein during the write operation the second power supply voltage is raised and the third power supply voltage is lowered.

6. The memory cell of claim 1, wherein the first inverter comprises:
    a first transistor having a first current electrode coupled to the first power supply voltage terminal, a control electrode coupled to the first storage node, and a second current electrode coupled to the second storage node; and
    a second transistor having a first current electrode coupled to the second current electrode of the first transistor, a control electrode coupled to the control electrode of the first transistor, and a second current electrode coupled to a ground terminal.

7. The memory cell of claim 6, wherein the second inverter comprises:
    a third transistor having a first current electrode coupled to the second power supply voltage terminal, a control electrode coupled to the second storage node, and a second current electrode coupled to the first storage node; and
    a fourth transistor having a first current electrode coupled to the second current electrode of the third transistor, a control electrode coupled to the control electrode of the third transistor, and a second current electrode coupled to a third power supply voltage terminal for receiving a third power supply voltage, wherein during a write operation, one of the second or third power supply voltages varied.

8. The memory cell of claim 1, wherein the access transistor is characterized as being a P-channel transistor.

9. A memory array, comprising:
    a plurality of memory cells organized in row and columns, wherein a row of memory cells comprises a word line and all of the memory cells coupled to the word line, wherein a column of memory cells comprises a bit line and all of the memory cells coupled to the bit line; and wherein each of the memory cells comprises:
        a first inverter having an input terminal coupled to a first storage node, an output terminal coupled to a second storage node, a first power supply voltage terminal for receiving a first power supply voltage, and a ground terminal;
        a second inverter having an input terminal coupled to the output terminal of the first inverter at the second storage node, an output terminal coupled to the input terminal of the first inverter at the first storage node, a second power supply voltage terminal, and a third power supply voltage terminal; and
        a read port coupled to one of the first or the second storage nodes;
    a first power supply conductor, coupled to the second power supply voltage terminals of each of the plurality of memory cells in a column of memory cells, the first power supply conductor traversing the memory array in a direction parallel to the column of memory cells; and
    a second power supply conductor, coupled to the third power supply voltage terminals of each of the plurality of memory cells in a row of memory cells, the second power supply conductor traversing the memory array in a direction parallel to the row of memory cells, wherein both of the second and third power supply voltage terminals receive power supply voltages that are independently variable with respect to the first power supply voltage during a write operation to each of the plurality of memory cells.

10. The memory array of claim 9, wherein during a write operation, a voltage measured between the second and third power supply voltage terminals is lower than a voltage measured between the first power supply voltage terminal and the ground terminal.

11. The memory array of claim 9, wherein the read port comprises:
    a first transistor having a first current electrode coupled to the ground terminal, a control electrode coupled to the first storage node, and a second current electrode; and
    a second transistor having a first current electrode coupled to the second current electrode of the first transistor, a control electrode coupled to a read word line, and a second current electrode coupled to a read bit line.

12. The memory array of claim 9, wherein the first inverter comprises:
a first transistor having a first current electrode coupled to the first power supply voltage terminal, a control electrode coupled to the first storage node, and a second current electrode coupled to the second storage node; and
a second transistor having a first current electrode coupled to the second current electrode of the first transistor, a control electrode coupled to the control electrode of the first transistor, and a second current electrode coupled to the ground terminal.

13. The memory array of claim 12, wherein the second inverter comprises:
a third transistor having a first current electrode coupled to the second power supply voltage terminal, a control electrode coupled to the second storage node, and a second current electrode coupled to the second storage node; and
a fourth transistor having a first current electrode coupled to the second current electrode of the third transistor, a control electrode coupled to the control electrode of the third transistor, and a second current electrode coupled to the third power supply voltage terminal.

14. A method for writing to a memory cell, the memory cell comprising a first inverter and a second inverter, the first inverter having an input terminal coupled to a first storage node and an output terminal coupled to a second storage node, the second inverter having an input terminal coupled to the second storage node and an output terminal coupled to the first storage node, the method comprising:
providing a first power supply voltage at a first potential to a first power supply voltage terminal of the second inverter;
providing a second power supply voltage at a second potential to a second power supply voltage terminal of the second inverter;
lowering the first power supply voltage;
raising the second power supply voltage;
coupling the first storage node to a bit line;
returning the first power supply voltage to the first potential;
returning the second power supply voltage to the second potential; and
decoupling the first storage node from the bit line.

15. The method of claim 14, further comprising providing a read port coupled to one of the first or second storage nodes.

16. A method for writing to a memory cell, the memory cell comprising a first inverter and a second inverter, the first inverter having an input terminal coupled to a first storage node and an output terminal coupled to a second storage node, the second inverter having an input terminal coupled to the second storage node and an output terminal coupled to the first storage node, a read port coupled to one of the first or second storage nodes, the method comprising:
providing a first power supply voltage at a first potential to a first power supply voltage terminal of the second inverter;
providing a second power supply voltage at a second potential to a second power supply voltage terminal of the second inverter but not to the first inverter;
lowering the first power supply voltage;
coupling the first storage node to a bit line;
returning the first power supply voltage to the first potential; and
decoupling the first storage node from the bit line.

17. The method of claim 16, wherein lowering the first power supply voltage further comprises raising the second power supply voltage and wherein returning the first power supply voltage to the first potential further comprises returning the second power supply voltage to the second potential.

18. The method of claim 16, wherein coupling the first storage node to the bit line further comprises coupling the first storage node to the bit line using a P-channel transistor.

* * * * *